(12) United States Patent
Lu

(10) Patent No.: US 6,275,836 B1
(45) Date of Patent: Aug. 14, 2001

(54) INTERPOLATION FILTER AND METHOD FOR SWITCHING BETWEEN INTEGER AND FRACTIONAL INTERPOLATION RATES

(75) Inventor: Jinghui Lu, Austin, TX (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/094,528

(22) Filed: Jun. 12, 1998

(51) Int. Cl.$^7$ ................................. G06F 7/10; G06F 7/17
(52) U.S. Cl. ............................................. 708/313; 708/316
(58) Field of Search .................................... 708/300, 313, 708/103, 316; 341/61

(56) References Cited

U.S. PATENT DOCUMENTS

| | | |
|---|---|---|
| 5,079,734 | 1/1992 | Riley . |
| 5,455,782 | 10/1995 | Young et al. . |
| 5,786,778 * | 7/1998 | Adams et al. .......................... 341/61 |
| 5,916,301 * | 6/1999 | Rothacher .............................. 708/313 |
| 5,963,153 * | 10/1999 | Rosefield et al. ....................... 341/61 |

OTHER PUBLICATIONS

Franca et al., *Design of Analog–Digital VLSI Circuits for Telecommunications and Signal Processing*, Second Edition, Prentice Hall 1994, pp. 251–288.

* cited by examiner

*Primary Examiner*—Chuong Dinh Ngo
(74) *Attorney, Agent, or Firm*—Kevin L. Daffer; Conley, Rose & Tayon P.C.

(57) ABSTRACT

A voice or data transmission system and specifically an interpolation filter used within the transmission system is provided for producing either fractional or integer interpolation ratios. The digital signal resulting from the interpolation filter has a relatively high signal to noise ratio whenever fractional interpolation is needed. The interpolation filter includes multiple stages coupled in series, and an integer interpolation branch switched in parallel with a fractional interpolation branch. A controller determines whether the integer or fractional interpolation ratio is needed based on maintaining a fixed oversampling data rate from the interpolation filter given a changing incoming sampling rate. If the incoming sampling rate should require fractional interpolation, then a branch implementing fractional interpolation ratio is used in lieu of the integer interpolation ratio. A comb filter is preferably introduced within the fractional interpolation branch to attenuate imaging tones within the baseband of interest. An interpolation rate change switch used by the comb filter beneficially moves the imaging tones further away from the baseband so that minimum imaging noise is introduced within the baseband by the fractional oversampling ratio.

20 Claims, 3 Drawing Sheets

US 6,275,836 B1

INTERPOLATION FILTER AND METHOD FOR SWITCHING BETWEEN INTEGER AND FRACTIONAL INTERPOLATION RATES

BACKGROUND OF THE INVENTION

1. Field of the Invention

This invention relates to a telecommunications system which can perform digital-to-analog ("D/A") conversion, or to an interpolation filter which can switch between integer and fractional interpolation rates to accommodate a fixed oversampling output rate for differing digital signal input frequencies.

2. Description of the Related Art

Mixed signal integrated circuits are generally well known as those which operate on both analog and digital signals. Such an integrated circuit may include analog-to-digital ("A/D"), D/A and digital signal processing (DSP) functions on a single monolithic substrate.

There are numerous types of mixed signal integrated circuits. One popular example involves a CODEC. Generally speaking, a CODEC may involve manipulating both analog and digital signals useful in the telecommunications field. An analog input signal is generally converted to a digital format, where multiple real-time operations can be readily performed on the digital signal before transmitting the digital signal onto a transmission medium. The CODEC can further include a mechanism for receiving digital signals from the transmission medium and converting those received signals to an analog format. Thus, encoding into a digital format and decoding from the digital format allows DSP operations to be performed using rapid digital operations. Operations such as multiplication, summing and delay can occur in succession on the digital signals before and after they are transmitted to enhance their transmissivity. These elemental operations an be performed many times for each sample of the incoming signal.

FIG. 1 is a block diagram of a CODEC 10, according to one conventional form. CODEC 10 includes an amplifier 12 having gains sufficient to forward an analog input signal $A_{IN}$ to an encoder 14. Encoder 14 may include many operational blocks which convert the analog input signal to a digital bit stream with minimum noise induced within the passband of interest. A popular A/D converter includes oversampled converters, or delta-sigma converters. Essentially, a delta-sigma converter digitizes an analog signal at a very high sampling rate (i.e., oversampling) to perform a noise-shaping function. Digital filtering after noise-shaping allows the delta-sigma converter to achieve a higher effective resolution than the analog input signal. Decimation can be used to reduce the oversampling data rate back to the original "Nyquist" rate.

The Nyquist data rate of the digital bit stream $D_{OUT}$ can be forwarded to a transmitter 16 as shown. Transmitter 16 as well as receiver 18 are situated near ports of CODEC 10 to transmit and receive respective digital signals through a channel 20 operably linked to CODEC 10. Similar to transmitter 16, receiver 18 may include amplification and/or error correction circuitry which operates solely within the digital domain. Resulting from receiver 18 is a digital bit stream $D_{IN}$ forwarded to a decoder 22. The analog output from decoder 22 can thereafter be amplified by amplifier 24 and presented back as an analog output signal $A_{OUT}$. Similar to encoder 14, decoder 22 includes a delta-sigma converter and a digital filter. However, instead of using the delta-sigma converter as an A/D converter followed by a digital decimation filter, decoder 22 is configured with an interpolation filter coupled to receive the digital input $D_{IN}$ prior to performing D/A conversion which uses, in part, a delta-sigma modulator.

FIG. 2 illustrates in more detail an exemplary set of blocks which may be used to form decoder 22. Several bit lines of a digital word can be fed as $D_{IN}$ to an interpolation filter 24. The data rate of each digital word is shown at frequency fs. Interpolation filter 24 includes a sampling rate conversion switch which increases the sampling rate of the incoming bit stream $D_{IN}$ from fs to a higher sampling rate Fs. The technique of sample rate conversion used in interpolation or decimation is generally well known. Included with sample rate conversion may be a filter transfer function carried out by operations performed by the DSP portion of the mixed signal integrated circuit. An execution unit which performs a summing, delay and/or multiplication operation can be used to implement any filter transfer function.

Delta-sigma modulator 26 within decoder 22 proves useful in noise-shaping the high data rate bit streams and may also serve to reduce a multi-bit digital word to a single sample width of one bit. Unlike a delta-sigma modulator within an A/D block, modulator 26 exclusively performs digital operations. The transfer function is implemented in the digital domain possibly with an infinite impulse response ("IIR") filter. The transfer function filtering operation performs the same modulator function as the A/D unit, where the in-band noise is suppressed but induces higher frequency quantization noise.

Output from delta-sigma modulator 26 can be fed as a single bit data stream transitioning at a relatively high rate Fs into a one bit D/A converter 28, and the output of converter 28 is filtered in the analog domain by smoothing filter 30. Smoothing filter 30 helps remove the shaped quantitization noise induced by modulator 26, and rejects any images which result above the output Nyquist rate fs.

A mixed signal integrated circuit is shown in FIGS. 1 and 2 to involve not only a mechanism to form a digital signal, but also recover analog information from that digital signal using an interpolation filter 24, followed by a delta-sigma modulator 26. The interpolation filter 24 thereby forms part of a transmission system and, more particularly, part of a D/A converter (or decoder). The multi-bit word line of interpolation filter 24 can receive a bit stream of varying data rate (i.e., frequency) depending on the telecommunications application. For example, the transmission system and particularly the CODEC can be called upon to send either data or voice information. This implies that the incoming data stream $D_{IN}$ can have a wide variety of frequencies fs depending on the transmitter/receiver constraints as well as the transmission medium. A variety of frequencies fs can also arise depending on the transmission system used and/or the transmission application desired. For example, modem applications involving data transmissions may utilize different frequencies fs than audio applications involving voice. However, to maintain compatibility with an existing (fixed) modulator 26 and D/A converters 28, the data rate Fs should remain consistent when changing from one input frequency fs to the next. This will enhance applicability of an existing D/A converter to many different input frequencies.

A need, therefore, exists for having an interpolation filter which can accommodate varying baseband sampling frequencies fs, and can interpolate those varying frequencies to a fixed oversampling frequency Fs for use by a delta-sigma modulator operating at a fixed sampling rate. The desirable interpolation filter would thereafter enhance applicability of existing D/A converters to many different input frequencies.

In order to accommodate a wide variety of input frequencies fs, the desired interpolation filter must not only involve a programmable interpolation rate, but also must be capable of selecting between fractional and integer interpolation rates on-the-fly.

SUMMARY OF THE INVENTION

The problems outlined above are in large part solved by an improved interpolation filter hereof. The interpolation filter can accommodate an incoming signal transitioning at varying sample rates fs. If the sample rate should change, the interpolation filter will modify its interpolation rate to maintain a constant and fixed oversampling output data rate Fs. The oversampling output can be maintained even if the interpolation rate involves switching between an integer and fractional interpolation ratio. In this manner, the interpolation filter used within the D/A converter can accommodate a transmission signal forwarded at virtually any incoming digital signal frequency less than half the sample rate.

The interpolation ratio supported by the present interpolation filter is programmable as either an integer number or a number having both integer and fractional values. The interpolation filter also does not require decimation at any stage within the interpolation filter. Thus, the programmable interpolation ratio does not produce a data rate which extends above the oversampled output Fs of the interpolation filter. Accordingly, throughout the present interpolation filter, an integer and/or fractional interpolation rate change occurs exclusively. The interpolation filter thereby avoids costly polyphase filters and unduly high intermediate frequencies associated with polyphase filters. The programmable interpolation rate involves possibly many stages of interpolation which increase the data rate directly to the oversampled output value without involving any intermediate or interim decimation stages. It has been determined that the present interpolation filter can achieve greater than 94 dB signal-to-noise performance.

According to one embodiment, the interpolation filter involves two interpolation branches coupled in parallel between a common input conductor and a common output conductor. One branch is used to accommodate integer interpolation, and the other branch accommodates fractional interpolation. Integer interpolation preferably involves a cosine filter (i.e., cosine transfer function) coupled in series with an interpolation sample and hold switch. The series-connected cosine filter and the sample and hold switch are connected between the input conductor and the output conductor. The second branch preferably involves a comb filter coupled in series with a sample and hold interpolation switch between the input conductor and the output conductor. Thus, the two branches can be considered coupled in parallel and a set of switches can be used to select between the branches depending on the digital bit stream received on the input conductor. The bit stream forwarded to the input conductor can be pre-conditioned possibly by upstream interpolation switches and associated filters.

Broadly speaking, a transmission system is set forth including a transmitter and a receiver. The receiver is coupled to a decoder, and the decoder is configured to receive a digital signal from the receiver. The digital signal transitions at a frequency which can vary depending on the application to which the transmission system is subjected. The decoder includes a first interpolation filter contained within a first branch and a second interpolation filter contained within a second branch. The first interpolation filter receives the digital signal during a first time duration and produces a first digital output signal having a data rate increased from the digital signal frequency by an integer number (i.e., $K_1$). The second interpolation filter receives the digital signal during a second time duration and produces a second digital output signal which transitions at a data rate increased by a fractional number (i.e., $K_2/J$) from that of the digital signal frequency. Additionally, the second digital output transitions at a data rate increased by the product of an integer number M and the fractional number $K_2/J$ from that of the digital signal.

According to one embodiment, the first interpolation filter within the first branch is coupled in parallel with the second interpolation filter within the second branch. The first interpolation filter may involve a cosine filter followed by a sample and hold interpolation switch having a rate change factor $K_1$. The second interpolation filter may involve a cosine interpolation filter having a rate change factor M, followed by a sample and hold switch having a rate change factor $K_2/J$. Rate change factor $K_1$ may or may not be equal to $K_2$, depending on the incoming sample rate fs.

The digital signal frequency fs of the incoming digital signal can vary significantly depending on, for example, whether voice or data is being transmitted. Regardless of fs, the sample rate output from the first and second branches during the respective first and second time durations remains the same. That is, Fs remains fixed since the first and second interpolation filters can accommodate dissimilar sample rate increases.

The cosine filter within the first branch may receive a digital signal transitioning at a first frequency during a first time duration and the comb interpolation filter within the second branch may receive the digital signal transitioning at a second frequency during a second time duration. Thus, the interpolation filter may further include a controller for connecting the digital signal to either the cosine interpolation filter or the comb interpolation filter depending on whether the digital signal is transitioning at the first frequency or the second frequency. The controller may therefore contain circuitry which senses the data rate of the incoming digital signal. Based on that sample rate, the controller then either (i) changes the amount by which the integer sample rate increasing switch modifies the sample rate if integer modification can be used, (ii) switches from the first branch to the second branch if fractional sample rate modification is needed, (iii) changes the fractional sample rate modification factor in the second branch if the incoming digital signal sample rate changes and still requires fractional sample rate modification, or (iv) switches back to the first branch if sample rate modification can be performed by an integer value rather than a fractional value. Of course, there may be numerous other scenarios by which the controller selects between the first branch and the second branch and modifies the sample rate change factors within those branches.

In addition to the transmission system, the D/A converter or the interpolation filter hereof, a method may be presented for inducing an interpolation rate change to a digital bit stream depending on the status of that bit stream. More specifically, the bit stream can be sampled at a first sample rate, and the first sample rate can be increased by an integer value to an oversampled rate Fs. The digital bit stream can then be sampled at a second sample rate dissimilar from the first sample rate which may therefore involve increasing the second sample rate by a fractional value to the oversampled rate Fs. Receiving the first and second sample rates involves switching the digital bit stream from an integer interpolation filter to a fractional interpolation filter when the first sample rate of the incoming signal changes to the second sample rate.

BRIEF DESCRIPTION OF THE DRAWINGS

Other objects and advantages of the invention will become apparent upon reading the following detailed description and upon reference to the accompanying drawings in which.

Figure 1:
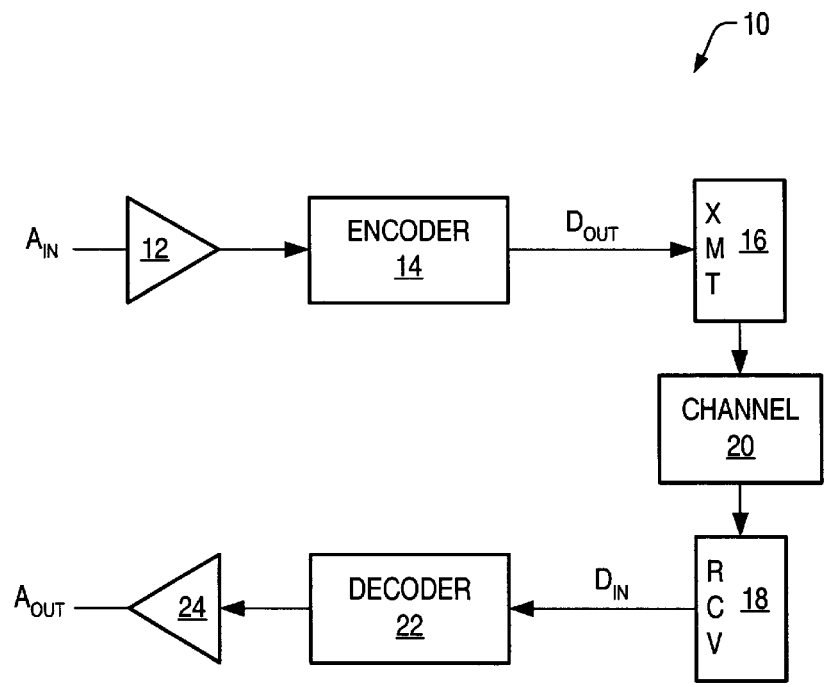
FIG. 1 is block diagram example of a conventional mixed signal system.
Figure 2:
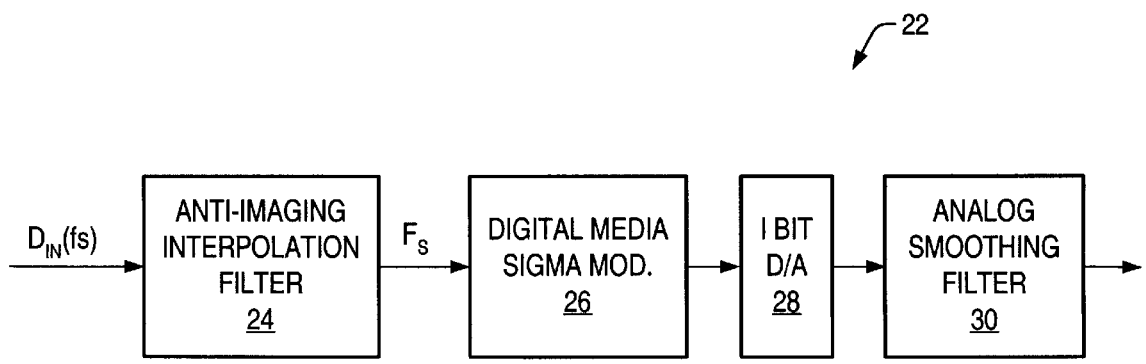
FIG. 2 is a block diagram example of the decoder illustrated in FIG. 1.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
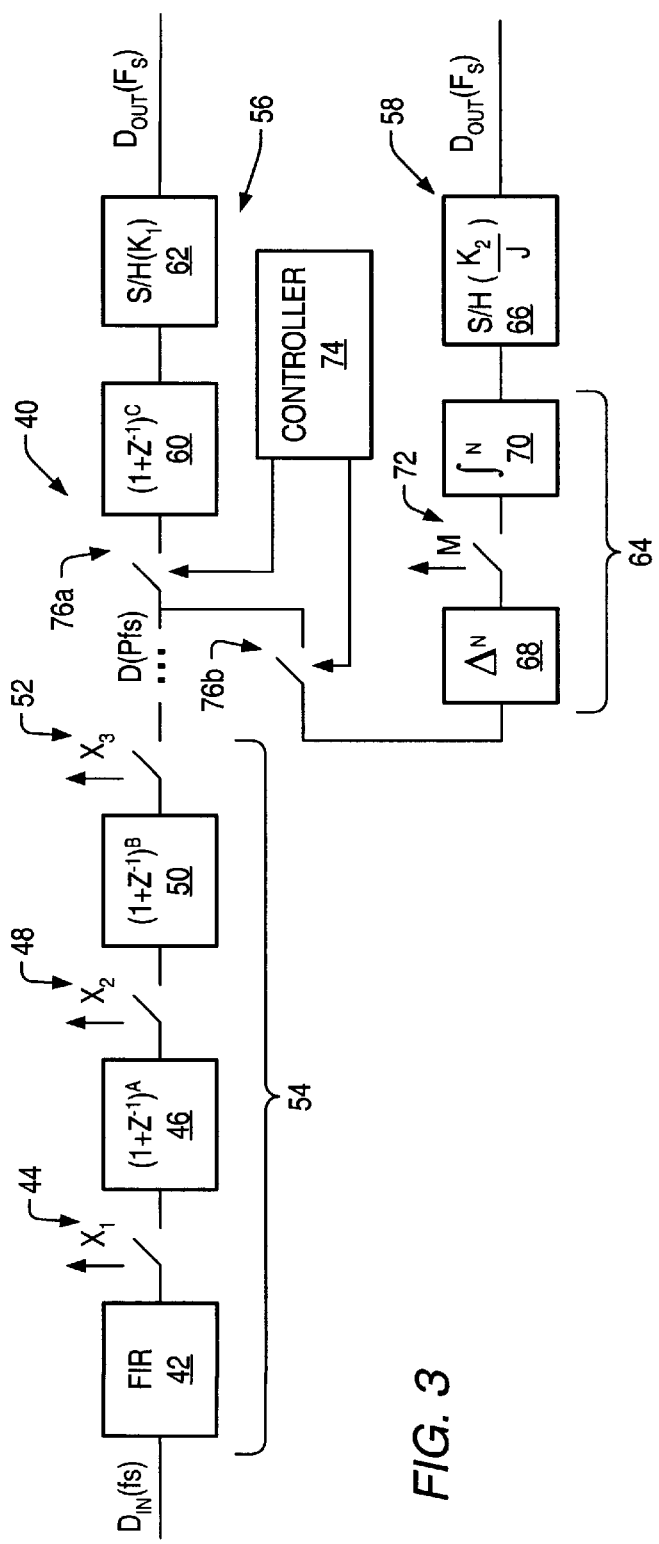
FIG. 3 is a symbolic representation of a switchable, multi-staged interpolation filter according to one embodiment.

Turning to FIG. 3, a block diagram of a multi-staged interpolation filter 40 is shown. Filter 40 can be implemented possibly within a D/A converter, or within a decoder of a digital signal transmission system. Interpolation filter 40 combines interpolation sample rate change switches with digital filtering transfer functions (i.e., DSP summing and delay operations) across multiple stages. This results in an increase in the computational efficiency if done correctly. There are numerous digital filters which can be implemented with interpolation. A popular filter includes the finite impulse response ("FIR") filter 42, often denoted as a moving weighted average filter. An advantage of FIR filters is that filter outputs need only be computed at the lower sample rate (prior to interpolation rate change switch 44) thereby achieving considerable efficiency in the computational process. The FIR filter 42 is only one example of a filter which receives the digital input signal $D_{IN}$ sampled at rate fs. Whatever filter transfer function is used, it is desired that the filtering characteristic demonstrate a fairly sharp reduction in amplitudes beyond a defined frequency value. For this reason, FIR filters may be employed as an early stage of interpolation filter 40.

Subsequent to interpolation rate change switch 44, a cosine filter 46 may be used. Cosine filter 46 is shown having a transfer function of $(1+z^{-1})^A$. The term A refers to the number of orders or terms linked in series from the output of sample rate change switch 44 and sample rate change switch 48. A single order cosine filter involves a delay element which receives an input digital bit stream and sums the delayed output with the digital bit stream input to produce a summed output. A general discussion of FIR filters and cosine filters, and the use of those filters in multiple stages implemented with multiple rates is set forth in, for example, U.S. Pat. Nos. 5,079,734 and 5,455,782, and further in an article to Franca, et al. entitled "Design of Analog-Digital VLSI Circuits for Telecommunications and Signal Processing," (Prentice Hall, 2nd Ed., 1994) pp. 251–288 herein incorporated by reference.

The transfer function of a cosine filter is described above as a pair of operations: a delay element and a summing node. Thus, the $1+z^{-1}$ is a term embodied as a hardware element or a microcode sequence. A suitable cosine operation of a single term can be carried out by one add and one delay element connected together in feedforward arrangement. If connected in feedforward with a negative add at the sum terminal, the term is said to represent a differentiator. If connected in feedback with a positive add at the sum terminal, the term represents an integrator. The combination of differentiators and integrators are useful in describing a sample and hold switch which essentially operates as a comb filter having differentiator and integrator components. As will be described herein below, a comb filter is desirably used in a second branch of interpolation filter 40 for the benefit of performing fractional sample rate modification. A comb filter is therefore dissimilar from a cosine filter which is carried out by feedforward with a positive add at the sum terminal. Of course, integrators, differentiators and cosine transfer terms may be separated by up sampling rate change switches in order to effectuate sample rate conversion among the various stages of those shown in FIG. 3.

Coupled to the output of interpolation switch 48 may be another cosine filter having possibly the same number of terms A or a dissimilar number of terms B used to represent the order of cosine filter 50. Another interpolation switch 52 may be connected subsequent to filter 50. The combination of switches 44, 48, and 52 with filters 42, 46, and 50 produce an overall, multi-staged interpolation filter front-end portion 54 of interpolation filter 40. The various filter transfer functions or terms can be changed, and the sequence or values of interpolation switches can be modified provided the incoming digital signal is filtered from noise contained on that signal. The amount of sample rate increase can also change and thus the values for the staged interpolation switches 44, 48, and 52 are represented as $X_1$, $X_2$, and $X_3$, respectively. It is noted herein below that the cumulative product of $X_1 * X_2 * X_3$ is equal to P. Regardless of the value of P and the mount or composition of filtering at front-end portion 54, a digital signal D sampled at ate Pfs is presented to one of two branches 56 or 58 depending on the variable, incoming ample rate Pfs relative to the desired, fixed output sample rate Fs.

First branch 56 preferably includes a cosine filter 60 followed by a rate change switch 62. Cosine filter 60 may have the same number of terms or orders as filter 46 or filter 50, or can have an altogether different number of orders labeled C. According to one example, C=2. It is noted that an increase in the number of orders will present a sharper cutoff at the passband edges. The cosine filter will accept signals only within a defined frequency range and will suffice to limit (i.e., attenuate) aliasing signals presented near the sidelobes of the cosine-filtered passband. Interpolation switch 62 provides an integer increase $K_1$ in sample rate. The Fourier transform of sample signals at the output of switch 62 has periodic images centered around all multiples of the sampling rate according to well known sampling theory. Insertion of zero-valued samples, or held samples, by sample rate conversion switch 62 does not alter the frequency domain description of the periodic images which remain centered around all multiples of the sampling rate. Cosine filter 60 serves to substantially eliminate images which fall far away from, or become aliased upon, the base band signal. This can be readily performed since the base band signal is centered around integer multiples of the sampling rate Pfs.

The second branch 58 includes a comb filter 64 and an interpolation rate change switch 66. Comb filter 64 can be represented as a differentiator 68 separated from an integrator 70 by an interpolation switch 72. Rate change switch 66 serves to increase the sample rate by a fractional value, or a value which includes a fractional number. The fractional or integer combined with fractional number is represented as $K_2/J$.

A controller 74 is used to control interpolation switches 76a and 76b. If the incoming data rate is of a certain magnitude that requires a fractional sample rate increase, then second branch 58 is used. However, if the incoming data rate merely requires an integer sample increase, then first branch 56 is used. Controller 74 determines which branch is to be used based on the incoming data sampling rate and selects a desired switch 76a or 76b depending on whether integer or fractional interpolation is needed. Controller 74 includes any sensing circuit, and a circuit responsive to the sensed signal for applying a selection voltage value to switch 76, possibly configured as a transistor.

Figure 4:
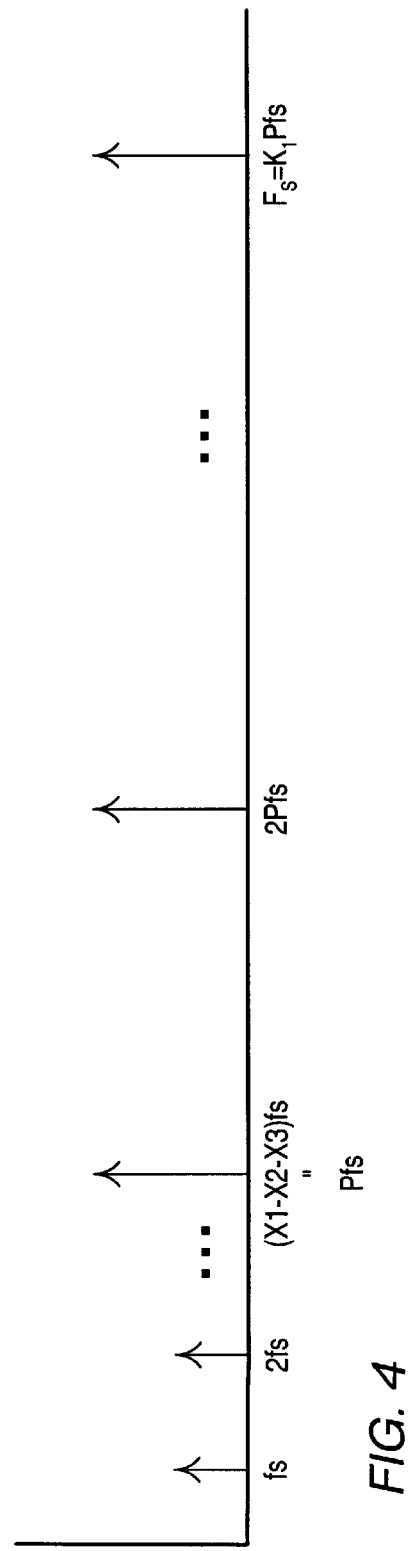
FIG. 4 is a frequency spectrum of an oversampled output frequency Fs produced from the interpolation filter of FIG. 3 in relation to a digital input signal sampled at frequency fs.

FIG. 4 is a graph of frequency vs. amplitude and, more specifically, represents a frequency spectrum and response magnitudes prior to front-end portion 54 and subsequent to front-end portion 54. Accordingly, the frequency spectrum represents the incoming sampling data rate fs after undergoing an initial sampling by an interpolation rate change switch to present multiple periodic images centered around multiples P of the sampling rate fs. The images continue for multiples of Pfs as a result of the sample and hold switch 62. Accordingly, FIG. 4 illustrates the frequency spectrum of a digital input signal $D_{IN}$ forwarded through front-end portion 54 and first branch 56 to present an output signal $D_{OUT}$ sampled at frequency Fs. The output sampling rate Fs=$K_1$*Pfs, and therefore is represented as an integer multiple of the original sampling rates fs. The images repeat at integer intervals of the incoming sampling rate fs, where out-of-baseband aliasing signals can be readily removed by cosine filters 46, 50, and 60, if desired.

FIG. 4 therefore represents the controller selecting the first branch for integer interpolation rate change. However, if the incoming data rate changes and fractional interpolation rate change is needed to maintain Fs fixed to that which was previously produced, then periodic images 80a and 80b centered around multiples of sampling rate fs (i.e., centered about integer KPfs) will encroach into the fractional baseband region of $PfsK_2/J$ shown in FIG. 5. The baseband of interest is less than an integer value away from integer multiples of sampling rate fs. It is noted that KP are integers, and the product of $K_2P$ is an integer. The imaging or aliasing bands 80a and 80b are found to be near KPfs and, unfortunately, within the baseband of $PfsK_2/J$. The fractional output sampling rate Fs of $PfsK_2/J$ will therefore receive the aliasing tones unless a comb filter is implemented before the fractional interpolation switch.

Figure 5:
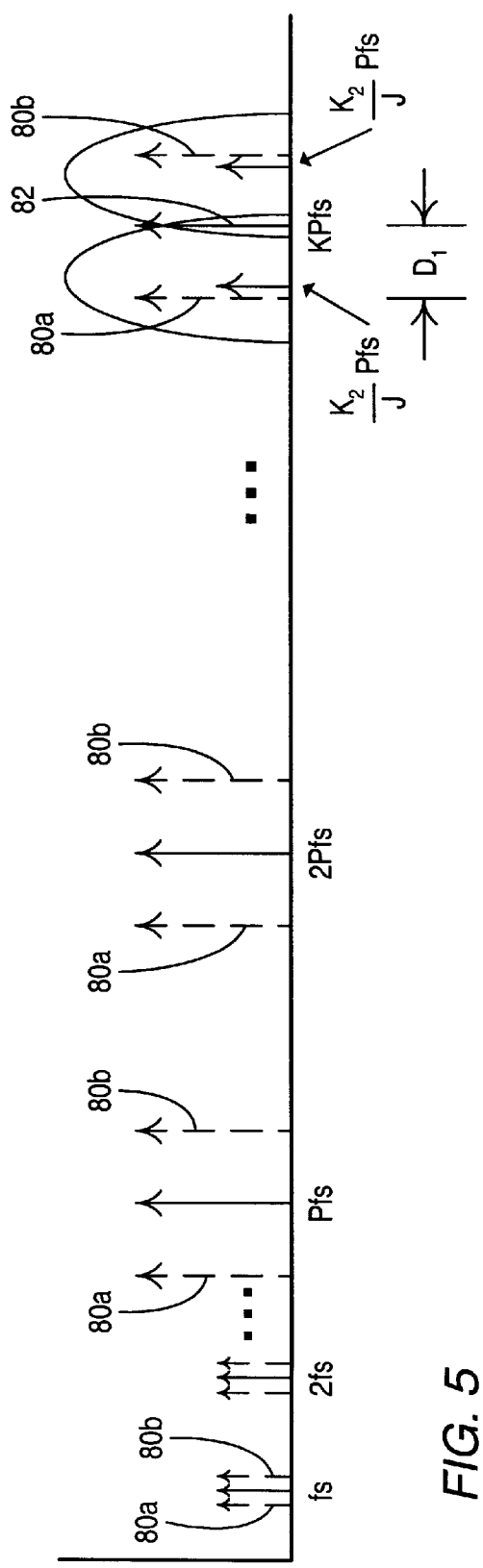
FIG. 5 is a frequency spectrum indicating a problem of an aliasing band encroaching upon the oversampled output frequency Fs whenever the interpolation rate includes a fraction.

FIG. 5 illustrates the frequency spectrum absent a comb filter. Thus, the comb filter 64 shown in FIG. 3 provides at least two distinct benefits. Comb filter of order N will present sharp attenuation of any aliasing tones that fall near the edge of the baseband. The greater the value of N, the greater the attenuation near the side lobes of the baseband. The comb filter can therefore be tuned by increasing the order of the comb filter and thereby suppressing or attenuating aliasing or imaging signals imaged from KPfs but relatively near the output sampling data rate.

A further advantage of the comb filter is the introduction of an additional sample rate conversion factor M. If M is sufficiently large, then the separation of the aliasing tones from KMPfs will be much larger than the separation between the imaging tones and a smaller sampling rate KPfs.

Figure 6:
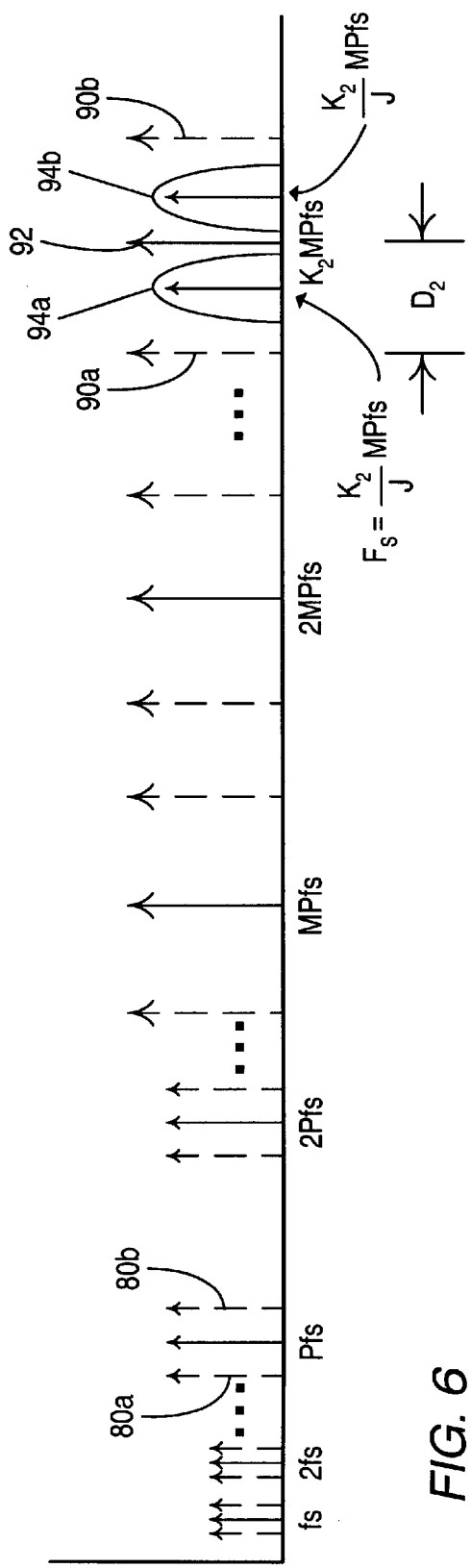
FIG. 6 is a frequency spectrum resulting from a comb interpolation filter introduced before the fractional sample and hold switch to reduce the alising band magnitude within Fs and to increase the relative separation between Fs and the aliasing band.

FIG. 6 illustrates the benefits of introducing a comb filter to solve the problem shown in FIG. 5. Specifically, the additional interpolation factor M multiplied with the pre-existing interpolation factor P will cause relative movement of the imaging tones 90a and 90b attributed to the multiple integer number KMPfs. Imaging tones 90a and 90b are represented as a proportion of the central sampling rate MPfs, similar to the ratio of imaging tones 80a and 80b relative to the central sampling rate Pfs, also shown in FIG. 6. FIG. 5 shows the relative difference $D_1$ between the central, multiple integer sampling rate 82 and the imaging tones 80. The additional separation (or difference $D_2$) between multiple integer sampling rate 92 and tones 90a and 90b shown in FIG. 6 is partially brought about by the introduction of sample rate interpolation factor M used to move the rather large aliasing tone 90 outside the baseband 94.

Although not restricted to a comb filter, a comb filter can be implemented whenever fractional interpolation rate change is needed. A filter such as a comb filter beneficially improves the signal to noise ratio to a value exceeding 94 db. The transfer filter functions within the first and second branches between sample rate Pfs to Fs are as follows:

Integer Ratio: $H_f(z)=(1+z^{-1})^{2}*((1-z^{-K_1})/(1-z^{-1}))$

Fractional Ratio: $H_r(z)=((1-z^{-M})/(1-z^{-1}))^{N}*((1-z^{-K_2/3})/(1-z^{-1}))$ where $z=e^{-jw}$.

The upper and lower branches 56 and 58 are switched onto the data path depending on whether integer or fractional interpolation ratios are needed. Merely as an example, if Fs must remain at 6.144 MHz, then a change in fs from 48.0 KHz to 44.1 KHz requires the controller to switch from the integer interpolation ratio to the fractional interpolation ratio (i.e., switch from the first branch to the second branch). The following represents examples various incoming data rates fs which may be used, the branch used, and the corresponding exemplary values for $K_1$, $K_2$, P, M, and J:

TABLE I.

| fs | $K_1P$ (integer) | $MPK_2/J$ (fractional) | Fs |
|---|---|---|---|
| 48.0 KHz | 128 | not applicable | 6.144 MHz |
| 44.1 KHz | not applicable | 418/3 | 6.144 MHz |
| 22.05 KHz | not applicable | 836/3 | 6.144 MHz |

It would be appreciated by those skilled in the art having the benefit of this disclosure that the transmission system, D/A converter, and the interpolation filter with switchable branches, or method thereof, is believed capable of applications in which noise can be reduced within a specific frequency range. Furthermore, it is also to be understood that the invention shown and described is to be taken as presently preferred embodiments. Various modifications and changes may be made to the design structure to optimize the term count and the overall filter composition as would be obvious to a person skilled in the art having the benefit of this disclosure. The specification and drawings are therefore to be regarded in an illustrative rather than a restrictive sense.

What is claimed is:

1. A transmission system, comprising:
   a receiver; and
   a decoder operably coupled to receive a digital signal from the receiver, wherein the digital signal operably transitions at a digital signal frequency fs, and wherein the decoder includes:
   a first interpolation filter adapted to receive a digital input signal derived from the digital signal and produce a first digital output signal during a first time duration, wherein the first digital output signal transitions at a data rate increased by an integer number $K_1$ from that of the digital input signal;
   a second interpolation filter adapted to receive the digital input signal and produce a second digital output signal during a second time duration dissimilar from the first time duration, wherein the second digital output signal transitions at a data rate increased by a fractional number from that of the digital input signal; and
   a control circuit adapted to direct the digital input signal to the first interpolation filter during the first time duration and to the second interpolation filter during the second time duration.

2. The transmission system as recited in claim 1, wherein the decoder further includes a modulator coupled to the first and second interpolation filters for receiving the first digital output signal during the first time duration and thereafter receiving the second digital output signal during the second time duration.

3. The transmission system as recited in claim 1, wherein the control circuit selects between the first and second interpolation filters to maintain a fixed data rate whenever the digital signal frequency changes.

4. The transmission system as recited in claim 1, wherein a frequency of the digital input signal is equal to Pfs, wherein P is an integer.

5. The transmission system as recited in claim 4, wherein the fractional number comprises a quotient of an integer $K_2$ and a value J such that the product of Pfs and $K_2/J$ during the second time duration is equal to the product of Pfs and $K_1$ during the first time duration.

6. The transmission system as recited in claim 5, wherein the fractional number further comprises an integer M multiplied by the quotient $K_2/J$ such that the product of Pfs and $MK_2/J$ during the second time duration is equal to the product of Pfs and $K_1$ during the first time duration.

7. The transmission system as recited in claim 5, wherein a first value of fs occurs during the first time duration and a second value of fs occurs during the second time duration.

8. An interpolation filter, comprising:
   a first interpolation filter coupled along a first signal path between an input conductor and an output conductor for performing an integer rate change during a first time duration;
   a second interpolation filter coupled along a second signal path between the input conductor and the output conductor for performing a fractional rate change during a second time duration dissimilar from the first time duration, wherein the first signal path is connected in parallel with the second signal path;
   a switch configured to connect the input conductor to the first interpolation filter during the first time duration and the second interpolation filter during the second time duration; and
   a third interpolation filter coupled between the input conductor and the switch.

9. The interpolation filter as recited in claim 8, wherein the output conductor is adapted to receive a digital output signal of a fixed data rate during both the first and second time durations.

10. The interpolation filter as recited in claim 8, wherein the output conductor is adapted to receive a digital output signal having a data rate during the first time duration that is equal to a data rate during the second time duration.

11. The interpolation filter as recited in claim 8, wherein said third interpolation filter comprises multiple stages.

12. An interpolation filter, comprising:
    a cosine interpolation filter coupled in series with an integer sample rate increasing switch for receiving a digital signal transitioning at a first frequency during a first time duration; and
    a comb interpolation filter coupled in series with a fractional sample rate increasing switch for receiving the digital signal transitioning at a second frequency during a second time duration.

13. The interpolation filter as recited in claim 12, further including a controller for connecting the digital signal to either the cosine interpolation filter or the comb filter depending on whether the digital signal is transitioning at the first frequency or the second frequency.

14. The interpolation filter as recited in claim 12, wherein the digital signal results from at least one interpolating sample rate increasing switch.

15. The interpolation filter as recited in claim 12, wherein the frequency of the digital signal transitioning during the first time duration times a magnitude of the integer sample rate increasing switch is equal to an oversampling frequency Fs, and the oversampling frequency Fs is equal in magnitude to the digital signal transitioning during the second time duration times a magnitude of the fractional sample rate increasing switch.

16. A method for inducing an interpolating rate change to a digital bit stream, comprising:
    receiving a digital bit stream sampled at a first sample rate;
    increasing the first sample rate by an integer value to an oversampled rate Fs using a first interpolation filter;
    receiving the digital bit stream sampled at a second sample rate dissimilar from the first sample rate; and
    increasing the second sample rate by a fractional value to the oversampled rate Fs using a first interpolation filter.

17. The method as recited in claim 16, wherein the oversampled rate Fs remains fixed regardless of whether the digital bit stream is sampled at the first sample rate or the second sample rate.

18. The method as recited in claim 16, wherein said increasing the second sample rate comprises switching the digital bit stream from an integer interpolation filter to a fractional interpolation filter when the first sample rate changes to the second sample rate.

19. The method as recited in claim 16, wherein said increasing the second sample rate comprises comb filtering the digital bit stream prior to feeding the digital bit stream to a fractional sample rate increasing switch.

20. The method as recited in claim 16, wherein said increasing the first sample rate comprises cosine filtering the digital bit stream prior to feeding the digital bit stream to the integer sample rate increasing switch.

* * * * *

UNITED STATES PATENT AND TRADEMARK OFFICE
CERTIFICATE OF CORRECTION

PATENT NO. : 6,275,836 B1
DATED : August 14, 2001
INVENTOR(S) : Lu

It is certified that error appears in the above-identified patent and that said Letters Patent is hereby corrected as shown below:

Column 10, claim 16,
Line 49, after the phrase "the oversampled rate Fs using a" please delete the word "first" and substitute therefor -- second --.

Signed and Sealed this

Ninth Day of April, 2002

Attest:

Attesting Officer

JAMES E. ROGAN
Director of the United States Patent and Trademark Office